United States Patent [19]

Scherer

[11] 4,266,089
[45] May 5, 1981

[54] ALL METAL FLAT PACKAGE HAVING EXCELLENT HEAT TRANSFER CHARACTERISTICS

[75] Inventor: Jeremy D. Scherer, S. Dartmouth, Mass.

[73] Assignee: Isotronics Incorporated, New Bedford, Mass.

[21] Appl. No.: 942,329

[22] Filed: Sep. 14, 1978

[51] Int. Cl.³ .............................................. H05K 5/04
[52] U.S. Cl. .................................. 174/52 FP; 29/588; 357/74
[58] Field of Search ........... 174/52 FP, 16 HS, 50.61, 174/50.56; 357/74, 81; 29/588

[56] References Cited

U.S. PATENT DOCUMENTS

| | | | |
|---|---|---|---|
| 2,880,383 | 3/1959 | Taylor | 174/52 FP |
| 3,190,952 | 6/1965 | Bitko | 174/52 FP |
| 3,548,076 | 12/1970 | Cooke et al. | 174/52 FP |
| 3,733,691 | 5/1973 | Mann | 29/588 |
| 3,988,825 | 11/1976 | Fuchs et al. | 29/622 |
| 4,063,348 | 12/1977 | Borden et al. | 29/588 |

*Primary Examiner*—Thomas J. Kozma
*Assistant Examiner*—D. A. Tone
*Attorney, Agent, or Firm*—Schuyler, Banner, Birch, McKie & Beckett

[57] ABSTRACT

An all-metal flat package for microcircuits is described which has a copper bottom and a stainless steel frame. Beryllia substrates carrying power chips can readily be soldered into the package which has good heat transfer characteristics.

6 Claims, 3 Drawing Figures

ALL METAL FLAT PACKAGE HAVING EXCELLENT HEAT TRANSFER CHARACTERISTICS

BACKGROUND OF THE INVENTION

This invention relates to microcircuit packages and more particularly to all-metal flat packages for microcircuits.

All-metal flat packages normally include three major metal components. The first component is a frame which generally is a continuous ring of metal that extends around the periphery of the package and which forms the side walls of the package. Electrical leads extending through the frame constitute the second component of the flat package. Most often the leads pass through two opposing sides of the package and are normally glass-sealed within holes in the frame. The third component of the package is the bottom upon which the microcircuit substrate is affixed. In addition to these three components, there is, of course, a lid which is attached after the microcircuit has been installed in the package.

Normally all-metal microcircuit packages which are flat packages are made of Kovar, with the Kovar frame and bottom often being joined together by a high temperature copper braze. Kovar is a trademark of the Westinghouse Corporation for an iron-nickel-cobalt alloy (29% nickel, 17% cobalt, 53% iron, and 1% minor ingredients). Indeed, Kovar flat packages comprise a great majority of the all-metal flat packages made in the world. Kovar is the likely choice for making all-metal flat packages since leads readily can be glass sealed in Kovar and since its coefficient of thermal expansion closely matches 96% alumina, the material normally used for microcircuit substrates which are housed in the packages. Since the coefficient of expansion of Kovar closely approximates that of alumina, the alumina substrate may be soldered to the Kovar package. While Kovar has good glass-sealing and thermal expansion properties, it has a very low coefficient of thermal conductivity, about 0.04 Cal/Cm$^2$/Cm/Sec/°C. This presents a problem of heat dissipation from power chips through the bottom of the flat package to a heat sink. About the only practical way to reduce the thermal impedence of an all-Kovar flat package is to employ a thin bottom, thereby reducing the length of the heat path from the substrate of the microcircuit chip to the heat sink. Such technique, however, reduces the strength of the package bottom.

Stainless steel or cold rolled steel have occasionally been used for flat packages. Leads readily can be compression glass-sealed in the steel frames but, since the coefficients of thermal expansion of stainless steel or cold rolled steel are considerably greater than 96% alumina, the alumina substrates are usually attached to the bottom of the flat package with an adhesive such as an epoxy. Unfortunately, attachment with adhesive tends to be an impediment to efficient heat transfer. Like Kovar, stainless or cold rolled steel possess very low coefficients of thermal conductivity making heat dissipation a problem. Moreover, soldering alumina substrates to steel is often not a feasible alternative to increase thermal conductivity. It has been found that if there is a significant mismatch in thermal expansion between the microcircuit substrate and the flat package bottom, and the substrate is soldered in place, the substrate will crack during thermal cycling and the thermal shock. For example, a span of more than about one-half inch of 96% alumina substrate when soldered into place on cold rolled steel normally will fail. Most microcircuits of the hybrid variety which dissipate a considerable amount of power utilize substrates significantly larger than one-half inch.

In an effort to accommodate power dissipation from substrates mounted in steel packages, some manufactures having divided the circuit into components. The power dissipation portion of the circuit, for example, is mounted on a beryllia pad and the remaining portion of the circuit may be attached to an alumina substrate. Beryllia is more thermally conductive than alumina and has a higher coefficient of expansion than alumina. The beryllia pad, since it carries only the power chip, may be relatively small, is generally round, and can be soldered to cold rolled steel to improve thermal conductivity. The remaining portion of the circuit, attached to an alumina substrate, does not dissipate substantial amounts of heat and can be positioned with epoxy.

DESCRIPTION OF THE INVENTION

One object of the present invention is to provide a flat package for microcircuits that is characterized by good heat transfer properties.

It is another object of this invention to provide a flat package for microcircuits having good heat transfer characteristics that permit a beryllia substrate to be soldered to its base.

This invention embraces an all-metal flat package for microcircuits having a copper bottom and a type 316 stainless steel frame which is brazed to said bottom with electrical leads glass-sealed in said stainless steel frame. In one embodiment this invention contemplates the method of providing a flat package for microcircuits comprising glass sealing electrical leads in a type 316 stainless steel frame and thereafter brazing the stainless steel frame at a temperature below about 460° C. to a copper bottom to provide a continuous seal between the stainless steel frame and the copper bottom.

The microcircuit package provided by this invention permits a beryllia pad to be packaged in a flat pack that has high heat transfer. The substrate can be soldered to the bottom of the package to provide a reliable bond to the flat package.

The package of this invention incorporates the benefits of copper with the benefits of stainless steel.

Copper has a coefficient of thermal expansion sufficiently close to beryllia to permit microcircuits carried on a suitably sized beryllia substrate to be soldered to the copper base. Care should be taken not to employ a beryllia substrate that is too large or some thermal expansion induced cracking may occur. While one skilled in the art can readily determine the maximum allowable beryllia substrate size for any given application in practice good results are achieved using small beryllia discs of about ¼ inch in diameter. These discs are small enough to avoid thermal expansion problems yet large enough to provide good electrical isolation. While copper is characterized by excellent heat transfer rate (about 1/Cal/Cm$^2$/Cm/Sec/°C.) it is not possible to glass-seal directly to copper and copper does not readily lend itself to welding (for cover attachment or the like).

Stainless steel permits reliable glass-sealing of electrical leads and ready attachment of covers by welding. These are important package considerations. Stainless steel, however, does not have heat transfer characteristics that are as high as copper. In order to provide a flat package that has a copper bottom and a stainless steel frame, it is necessary to observe processing limitations in the manufacture of the package.

The ability of a flat package to dissipate heat requies a truly flat bottom for a good connection to an external heat sink. The coefficient of expansion of copper and type 316 stainless steel are not identical and, in accordance with this invention, the stainless steel frame and the copper bottom are joined by brazing at a temperature below about 460° C. In order to form a hermetic package, the brazing forms a continuous seal between the frame and the bottom. While brazing at higher temperatures provides a reliable joint, processing at temperatures above about 460° C. can create sufficient stresses to introduce undesirable irregularities in the bottom when the unit cools. Suitable brazes which can be employed in the practice of this invention include gold/tin, gold/germanium and the like.

Further, in accordance with this invention, the electrica leads are glass sealed in the stainless steel frame before the frame is brazed to the copper bottom. This permits effective assembly of the leads, frame and bottom without subjecting the assembled frame and bottom to temperatures above about 460° C. Compression glass-sealing of electrical leads in steel is, of course, well known in the art.

After the copper bottom and stainless steel frame with electrical leads are assembled, the package is ready for the installation of the microcircuit substrate or substrates. A substrate carries electrical components and is provided with terminal areas to which the electrical leads which pass through the stainless steel frame are attached. The beryllia substrate may be soldered to the copper bottom and the electrical leads may be soldered to the appropriate terminal areas. The attachment of the beryllia substrate to the copper bottom and the electrical leads to the terminals may be accomplished employing standard solders including, for example, tin/lead, gold/tin, gold/germanium or any other solder or braze which is compatible with the surface of the two materials solder or braze which is compatible with the surface of the two materials being joined.

As indicated earlier, the beryllia substrate can carry heat generating microcircuits which require that the heat be dissipated. Typical heat generating microcircuits include power chips such as voltage regulators, voltage dividers and the like. Power chips are, of course, well known in the art. The entire microcircuit can be carried on a beryllia substrate. As an alternative, portions of the microcircuit which do not dissipate power and, therefore, do not generate significant heat can be carried by a 96% alumina substrate. Such substrates can be mounted on the copper bottom by an adhesive, or the like.

After the substrate is mounted in the package and the electrical connections are made, a lid is affixed to the package to provide a hermetic seal. The lid is preferably made of stainless steel and may be attached by welding or by adhesive. Welding is often preferred.

The invention may be better understood with reference to the attached drawings.

Figure 1:
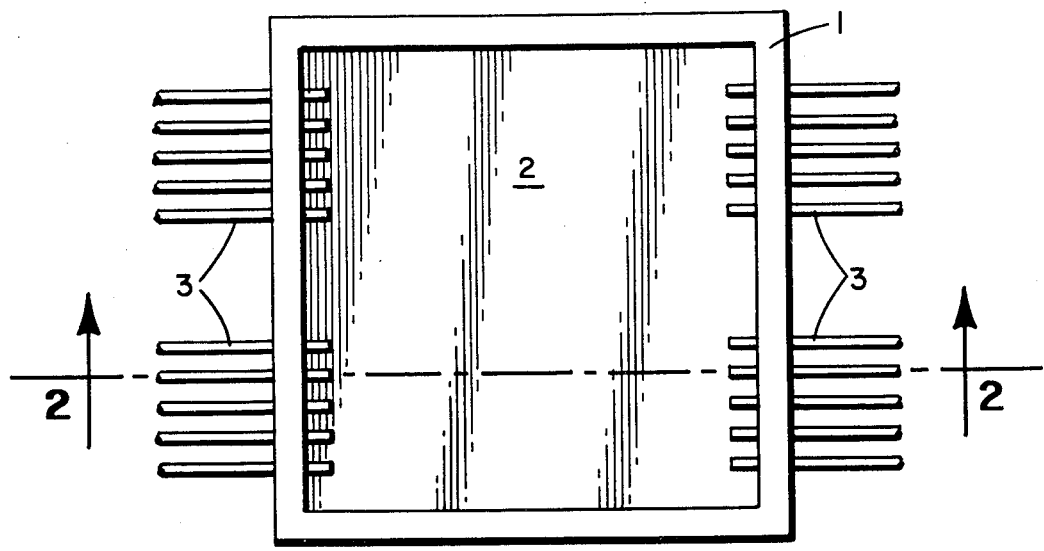
FIG. 1 is a plan view of a frame, bottom and leads of a flat package.
Figure 2:
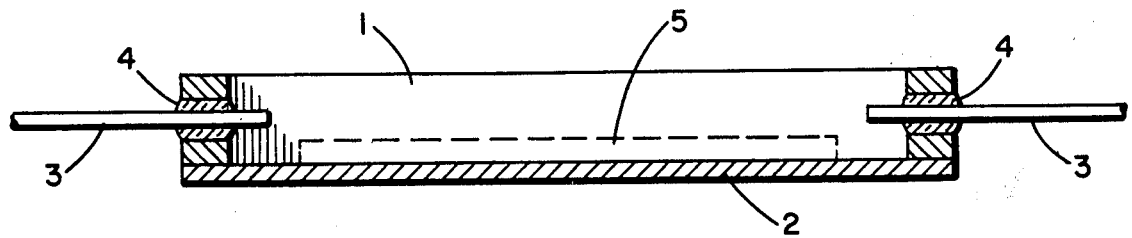
FIG. 2 is a sectional view taken along line 2—2 of FIG. 1
Figure 3:
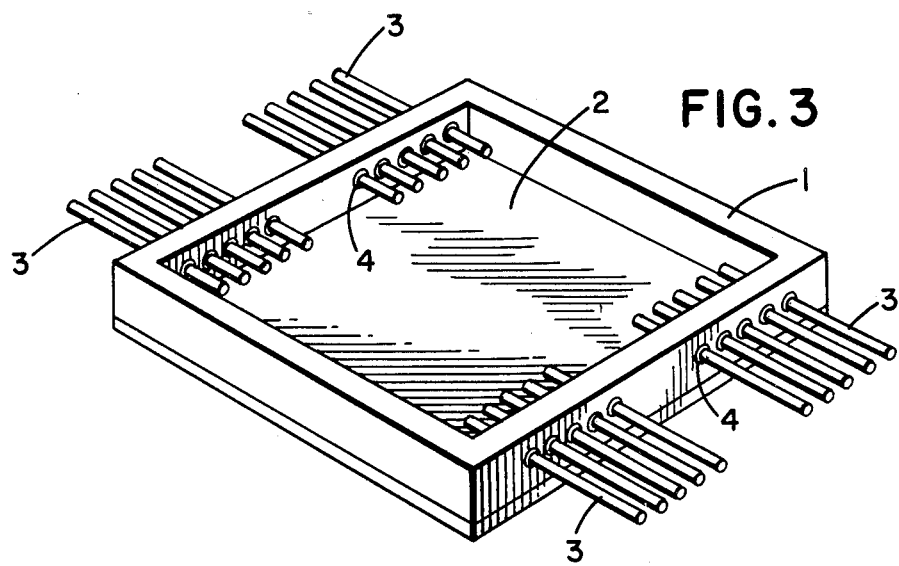
FIG. 3 is a perspective view of the flat package.

The flat package depicted in the drawings consists of stainless steel frame 1 with copper bottom 2 and electrical leads 3. The electrical leads are compression glass-sealed in openings in the stainless steel frame with glass seals 4. A beryllia substrate 5 carrying one or more power chips may be soldered to the bottom of the flat package as shown in dashed lines in FIG. 2.

The size and configuration of a flat package varies depending on the specific application. The package may be square, rectangular or some other shape. The number of electrical leads will also vary depending on the spacific application. The leads may be sealed in one or more sides of the flat package. In a typical 1 inch (2.54 cm) by 1 inch (2.54 cm) package, the bottom may be 0.02 inches (0.05 cm) thick while the frame may be 0.04 inches (0.1 cm) thick and 0.130 inches (0.33 cm) high. The choice of dimensions for any given flat package is within the skill of the routineer.

Since modifications of this invention will be apparent to those skilled in the art, it is intended that this invention be limited only by the scope of the appended claims.

I claim:

1. The method of manufacturing a flat package for electric microcircuits comprising:
   glass-sealing electrical leads in apertures in a type 316 stainless steel frame, and thereafter brazing the stainless steel frame at a temperature below about 460° C. to a copper bottom.

2. The method of claim 1 wherein a beryllia substrate is soldered to the copper bottom after the stainless steel frame and the copper bottom are assembled.

3. A flat package for electric microcircuits comprising:
   (a) a type 316 stainless steel frame having electrical leads extending therethrough, said leads being glass-sealed therein:
   (b) a flat copper bottom;
   (c) said stainless steel frame forming the side walls of the package and being brazed to said copper bottom to form a continuous seal between said frame and said bottom; and
   (d) said brazing have been accomplished after the electrical leads were glass-sealed in said frame and at a temperature below about 460° C.

4. The package of claim 3 containing a microcircuit on a beryllia substrate which is soldered to said bottom.

5. The package of claim 4 wherein a power chip is mounted on said beryllia substrate.

6. The microcircuit package of claim 3 containing a steel lid which is welded to said frame.

* * * * *